(12) United States Patent
Ramakrishnan

(10) Patent No.: US 6,828,682 B1
(45) Date of Patent: Dec. 7, 2004

(54) SUBSTRATE VOLTAGE CONNECTION

(75) Inventor: Arun Ramakrishnan, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/635,276

(22) Filed: Aug. 6, 2003

(51) Int. Cl.[7] .............................................. H01L 23/48
(52) U.S. Cl. ...................................... 257/758; 257/701
(58) Field of Search ................................ 257/701, 702, 257/758–760; 361/735–737, 728, 820, 826

*Primary Examiner*—Eddie Lee
*Assistant Examiner*—Douglas W. Owens
(74) *Attorney, Agent, or Firm*—Luedeka, Neely & Graham, P.C.

(57) ABSTRACT

A substrate that includes a non-electrically conductive core having a first side and an opposing second side. A first electrically conductive layer is disposed on the first side of the core, and a second electrically conductive layer is disposed on the second side of the core. Electrically conductive core vias extend from the first side of the core to the second side of the core. The core vias are disposed in an array. An electrically conductive contact is formed on an upper build-up layer on the first side of the core, and overlies the array of core vias. A first electrically conductive via electrically connects the contact to an intervening build-up layer disposed between the upper build-up layer and the first electrically conductive layer. The first via overlies the core via array. A second electrically conductive via electrically connects the intervening build-up layer and the first electrically conductive layer, where the second electrically conductive via is not disposed over the core via array.

15 Claims, 2 Drawing Sheets

SUBSTRATE VOLTAGE CONNECTION

FIELD

This invention relates to the field of integrated circuit fabrication. More particularly, this invention relates to packaging for integrated circuits.

BACKGROUND

Integrated circuits, such as bump bonded flip chip integrated circuits, are typically electrically and mechanically housed in a package prior to use in a larger circuit. The package provides several important functions for the integrated circuit. First, the package provides mechanical and structural support to the integrated circuit, and thus protects it from physical damage. Additionally, the substrate, which is the interposer between the integrated circuit and the printed circuit board and forms the base of the package, physically spreads out, or routes, the electrical connections that are made to the integrated circuit on one side of the substrate, so that electrical connections to other parts of the overall circuit, such as to a printed circuit board, can be more easily made on the other side of the substrate.

One type of substrate is fabricated with a relatively rigid sheet of a non-electrically conductive material, called a core, upon which one or more build-up layers are formed, typically on both sides of the core. For example, the core may have electrically conductive layers formed on both of its sides, which are then covered with a non-electrically conductive layer, and then another electrically conductive layer, and so on until the desired number of electrically conductive layers have been formed.

The electrically conductive layers in the substrate are patterned, typically at the time that they are formed, so as to provide specific functions. For example, on an electrically conductive layer on which signals from the integrated circuit are conducted, the layer typically includes a plurality of electrically conductive lines or signal traces, which route the signal from one part of the substrate, such as an inner portion, to a different part of the substrate, such as a more peripheral portion. An electrically conductive layer that provides a ground plane is typically a large, contiguous, electrically conductive sheet. Finally, an electrically conductive layer that provides a power plane typically includes multiple electrically conductive sheets that do not electrically connect one with another, at least not on that same layer.

Electrical connections from one to another of the electrically conductive layers of the substrate are provided by forming holes in the non-electrically conductive layers between them, and either coating or filling the holes with an electrically conductive material. Such structures are called vias. Vias typically must also be formed through the substrate core. These core vias can be formed by mechanical or laser drilling. Because the core is typically much thicker than any of the build-up layers, core vias are often much larger than the vias that extend between the electrically conductive build-up layers.

Unfortunately, the large size of the core vias can present problems when designing a substrate. For example, in one substrate design it is desirable for all of the core vias to be disposed in an array in the center of the core. However, this relatively dense array of large core vias prohibits making direct electrical connections between contacts on the integrated circuit that overlie the core via array and the electrically conductive layers disposed directly on the core, because the electrically conductive layer typically cannot be "threaded" through the relatively densely packed via array to reach the location that underlies the centrally disposed integrated circuit contact.

What is needed, therefore, is a substrate design that allows for electrical connections between the electrically conductive layer on the substrate core and electrical contacts that overlie a centrally disposed and densely packed core via array.

SUMMARY

The above and other needs are met by a substrate design that includes a non-electrically conductive core having a first side and an opposing second side. A first electrically conductive layer is disposed on the first side of the core, and a second electrically conductive layer is disposed on the second side of the core. Electrically conductive core vias extend from the first side of the core to the second side of the core. The core vias are disposed in an array. An electrically conductive contact is formed on an upper build-up layer on the first side of the core, and overlies the array of core vias. It is desired to connect the contacts on this upper build-up layer to the electrically conductive layer on the first side of the core. A first electrically conductive via connects the contact to an intervening build-up layer disposed between the upper build-up layer and the first electrically conductive layer. The first via overlies the core via array. A second electrically conductive via connects the intervening build-up layer and the first electrically conductive layer on the core, where the second electrically conductive via is not disposed over the core via array.

In this manner, contacts that are disposed over the core via array can be electrically connected to the electrically conductive layer disposed on the core, even when the core via array is too dense to be penetrated by the electrically conductive layer, or in other circumstances where it is undesirable for the electrically conductive layer to extend into the core via array. Further, this is accomplished without the need to completely sacrifice the utility of one of the other layers, or by adding an entirely new layer.

In various preferred embodiments, the intervening layer is a signal routing layer, a portion of which is used for making the desired electrical connections. The core via array is preferably centrally disposed in the substrate. Preferably, the core via array is too densely packed for the first electrically conductive layer to penetrate the core via array. The contact is preferably a VDDIO contact disposed in an interior portion of the substrate. Preferably, the first electrically conductive layer is a VDDIO layer. Preferably, the first via, intervening layer, and second via are a plurality of intervening layers and a plurality of electrically conductive vias electrically connecting the contact to the first electrically conductive layer. A packaged integrated circuit including the substrate described is also disclosed herein.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
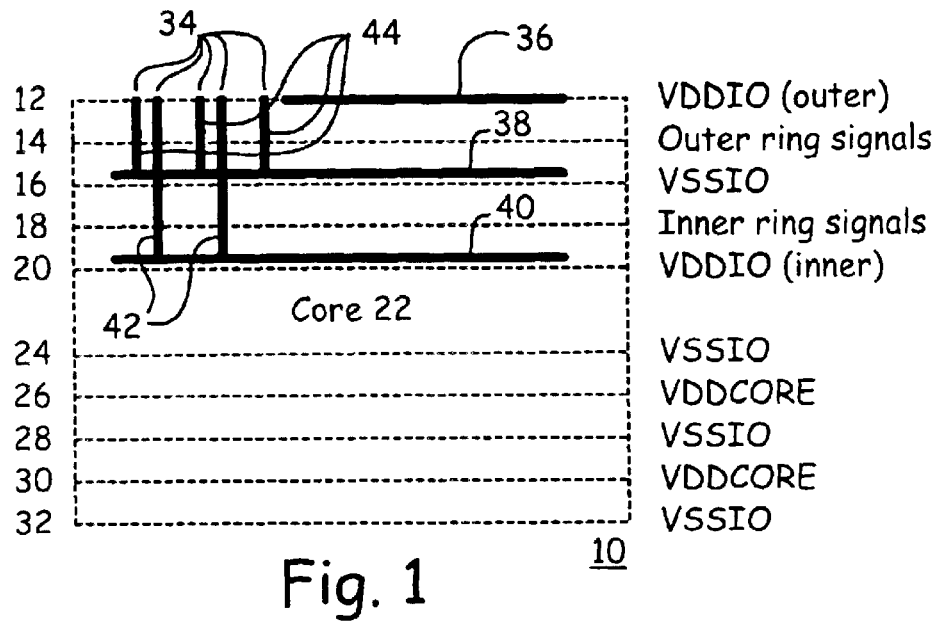
FIG. 1 is a cross sectional view of a portion of a substrate.

With reference now to FIG. 1 there is depicted a cross sectional view of a portion of a substrate 10. In the specific embodiment depicted in FIG. 1, the substrate 10 includes a core 22 with four build-up layers on either side of the core 22. Specifically, the substrate 10 has a first electrically conductive layer 20 that is formed directly on a first side of the core 22, and then four build-up layers 12, 14, 16, and 18 on top of the first side of the core 22, where layer 12 is the upper most layer on the first side of the substrate 10. Similarly, the substrate 10 has a second electrically conductive layer 24 that is formed directly on a second opposing side of the core 22, and then four build-up layers 26, 28, 30, and 32 on top of the second side of the core 22, where layer 32 is the upper most layer on the second side of the substrate 10. It is appreciated that the number of layers as depicted in FIG. 1 is representative only, and that in various embodiments of the invention, the substrate 10 may include either a greater or a lesser number of such build-up layers, within the constraints as dictated by the description contained herein.

The electrically conductive layers are disposed between non-electrically conductive layers, which electrically insulate the electrically conductive layers one from another. In the example as depicted in FIG. 1, there are a number of electrically conductive contacts 34 disposed on the upper most layer 12 of the substrate 10. Some of the contacts 34 are electrically connected to vias 44, which electrically connect the contacts 34 to structure 38 on layer 16. Others of the contacts 34 are electrically connected to vias 42, which electrically connect the contacts 34 to structure 40 on layer 20, which is directly adjacent to the core 22 on the first side.

FIG. 1 also provides a legend on the right hand side of the figure, in which there is given the layer designations for a very specific embodiment of the invention. In this specific embodiment, the upper most layer 12 also includes a VDDIO structure 36, which is the power plane for the input/output circuitry disposed in an outer portion of the integrated circuit. Layer 16 includes a VSSIO structure 38, which is the ground plane for the input/output circuitry disposed in both the outer portion and the inner portion of the integrated circuit. Layer 20 includes a VDDIO structure 40, which is the power plane for the input/output circuitry disposed in an inner portion of the integrated circuit. Layers 14 and 20 contain circuitry for the outer rings and inner ring of signals, respectively. Again, it is appreciated that these layer assignments are representative only.

Figure 2:
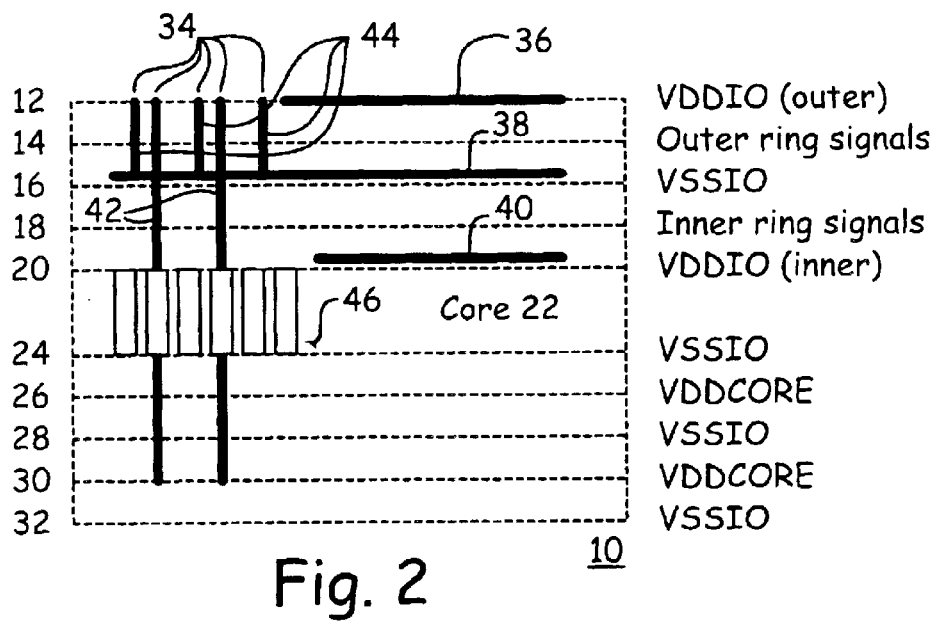
FIG. 2 is a cross sectional view of a portion of a substrate, where core vias interfere with electrical connections between an electrically conductive layer on the core and contacts that overlie the core vias.

FIG. 2 depicts a portion of the substrate 10 that is similar to that depicted in FIG. 1, except that the contacts 34 overlie an array of large and densely packed array of core vias 46. Because the core vias 46 are so tightly spaced in the array, the VDDIO structure 40 for the inner input/output circuitry cannot penetrate the array and make electrical connections with the vias 42 on layer 20 without shorting to the core vias 46. Thus, in the embodiment of FIG. 2, some of the core vias 46 are dedicated to the vias 42, and then electrical connections between the vias 42 and the VDDIO structure 40 are made on one or more of the layers on the second side of the core 22.

This condition presents some problems. First, it may not be desirable to dedicate the core vias 46 in the manner described. Second, it may not be desirable to dedicate any of the electrically conductive layers on the second side of the substrate 10 to electrically connecting the vias 42 with the VDDIO conductor 40. For example, in the specific embodiment indicated in FIG. 2, one of the VDD or VSS layers on the second side would need to be preempted for the electrical connections between the VDDIO structure 40 and the vias 42.

Figure 3:
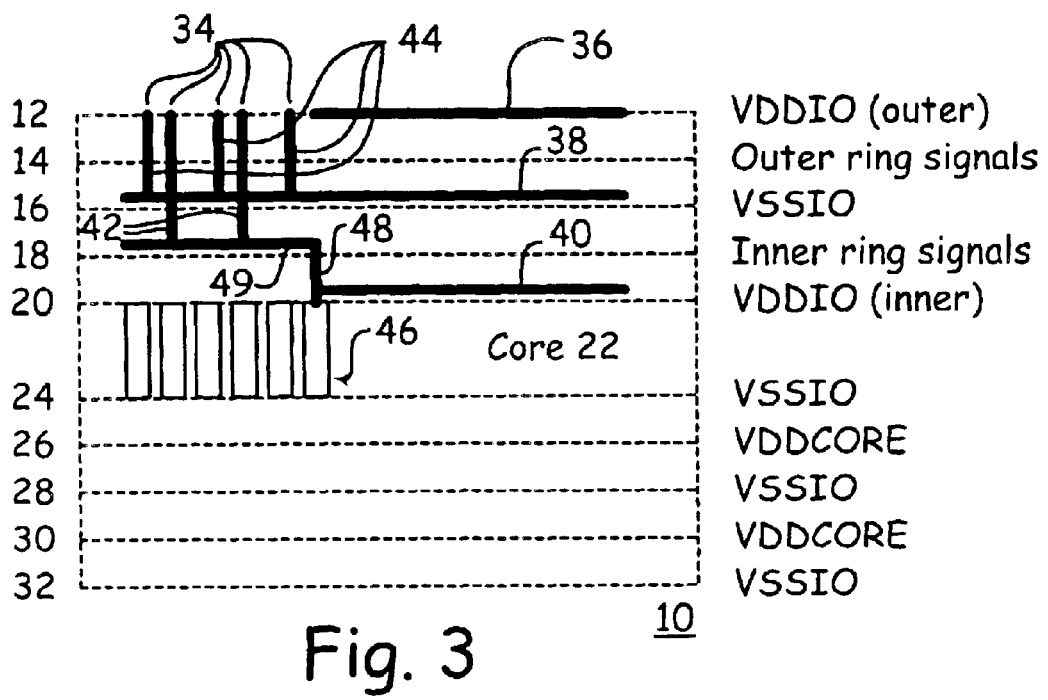
FIG. 3 is a cross sectional view of a portion of a substrate, where a modified routing scheme has been used to allow electrical connections between an electrically conductive layer on the core and contacts that overlie the core vias.

In a preferred embodiment, an intermediate electrically conductive layer on the first side of the core 22 is preferably used to make electrical connections between the vias 42 and the structure 40. This is most preferably accomplished on one or more of the signal routing layers, because it preferably does not entirely preempt the signal routing layer so used, and thus does not reduce the functional or electrical integrity of the substrate 10. In the embodiment of FIG. 3, the vias 42 are electrically connected to a structure 49 disposed on the electrically conductive layer 18, which in the specific embodiment is the routing layer for the inner ring of signal contacts, as described in more detail elsewhere herein. The structure 49 is preferably electrically connected to the structure 40 such as by one or more electrically conductive vias 48. One or more core vias 46 in the outermost row of the core via array are then used for completing the VDDIO connection on the first side of the core 22.

Figure 4:
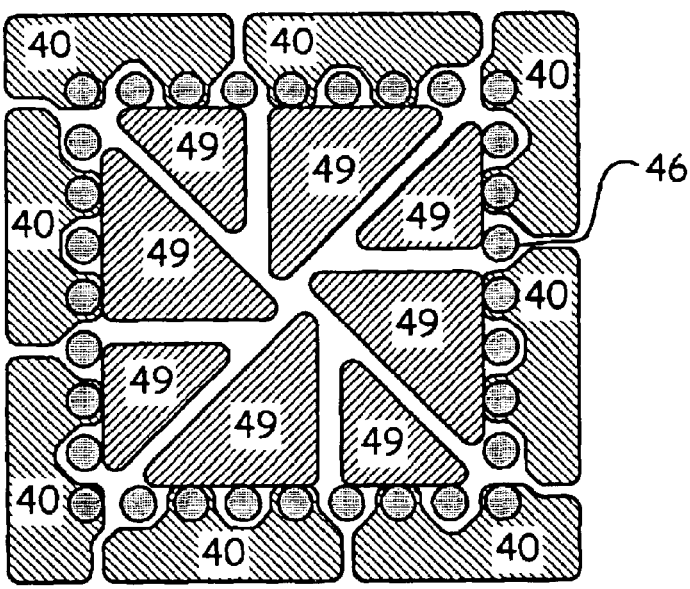
FIG. 4 is a superimposed top plan view of a portion of a substrate, depicting the overlap between different electrically conductive layers in the substrate.

FIG. 4 provides a top composite view of such an embodiment as depicted in FIG. 3. As seen in FIG. 4, structures 40 are disposed on layer 20 in a more peripheral portion of the substrate 10. Structures 49 are disposed on layer 18 in a more central portion of the substrate 10. The structures 49 do not interfere with the core via array because they are disposed on a layer that is above the core via array. As depicted, some of the outermost core vias 46 can be used to electrically connect to the structures 40. Vias 48, not depicted in FIG. 4, electrically connect the structures 40 to the structures 49.

The above configuration is beneficial in many different situations. One such situation is next presented.

LSI Logic Corporation's F1xIO bump pattern consists of a matrix of core power (VDDCORE) and core ground (VSSCORE) bumps surrounded by two rings of signals (IOs), each with its own power (VDDIO) and ground (VSSIO) reference. One specialty of the F1xIO bump pattern is that the IOs in the inner ring can be moved to the center of the die if required, thus saving real estate on the die. In order to provide VDDIO referencing on the substrate 10 for the IO slots that are moved to the center of the die, some of the VDDCORE bumps are converted to VDDIO. The challenge for the substrate designer is then to connect the VDDIO bumps in the center of the die to the VDDIO planes in the periphery of the substrate 10.

In the F1xIO stackup, the VDDIO plane for the inner ring of IOs is preferably on one of the core 22 layers 20 or 24, which means that a second VDDIO plane layer would be required to connect the bumps 34 in the center to the peripheral plane. This means that either a) an extra layer below the core is needed to establish the VDDIO (inner) connection, or b) core vias need to be lost. The first option implies wasting a layer, and the second a loss in VSSCORE-VDDCORE via coupling.

Thus, in the embodiments described herein, the VDDIO (inner) bumps are connected to an intermediate plane on layer 18 instead of a separate plane below the core. This intermediate plane on layer 18 is then connected to the main VDDIO plane on layer 20 through a buried build-up via going from layer 18 to layer 20. In one embodiment, only half the core vias 46 in the outermost row of the array are re-assigned from VDDCORE to VDDIO, so there is a minimal effect on VSSCORE-VDDCORE via coupling through the core 22.

With the configuration as described herein, the layer stackup below the core 22 remains unchanged, core via 46 coupling is not compromised, and all the layers retain their original assignment. These embodiments further allow two planes below the core 22 to be assigned to VDDCORE, which helps increase the capacitance between VDDCORE and VSSCORE planes, ultimately reducing core noise. This approach is applicable to all flip chip packaging technologies with thick cores that need to connect power or ground IO bumps in the center of the die to planes in the periphery without compromising core via coupling or layer count.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A substrate, comprising:
   a non-electrically conductive core having a first side and an opposing second side,
   a first electrically conductive layer disposed on the first side of the core,
   a second electrically conductive layer disposed on the second side of the core,
   electrically conductive core vias extending from the first side of the core to the second side of the core, the core vias disposed in an array,
   an electrically conductive contact formed on an upper build-up layer on the first side of the core, the contact overlying the array of core vias,
   a first electrically conductive via electrically connecting the contact to an intervening build-up layer disposed between the upper build-up layer and the first electrically conductive layer, the first via overlying the core via array, and
   a second electrically conductive via electrically connecting the intervening build-up layer and the first electrically conductive layer, the second electrically conductive via not disposed over the core via array.

2. The substrate of claim 1, wherein the core via array is centrally disposed in the substrate.

3. The substrate of claim 1, wherein the core via array is too densely packed for the first electrically conductive layer to penetrate the core via array.

4. The substrate of claim 1, wherein the contact is VDDIO contact disposed in an interior portion of the substrate.

5. The substrate of claim 1, wherein the first electrically conductive layer is a VDDIO layer.

6. The substrate of claim 1, wherein the first via, intervening layer, and second via comprise a plurality of intervening layers and a plurality of electrically conductive vias electrically connecting the contact to the first electrically conductive layer.

7. The substrate of claim 1, wherein the intervening build-up layer is a signal routing layer.

8. A packaged integrated circuit including the substrate of claim 1.

9. A substrate, comprising:
   a non-electrically conductive core having a first side and an opposing second side,
   a first electrically conductive layer disposed on the first side of the core,
   a second electrically conductive layer disposed on the second side of the core,
   electrically conductive core vias extending from the first side of the core to the second side of the core, the core vias in an array centrally disposed in the substrate, wherein the core via array is too densely packed for the first electrically conductive layer to penetrate the core via array,
   an electrically conductive contact formed on an upper build-up layer on the first side of the core, the contact overlying the array of core vias,
   a first electrically conductive via electrically connecting the contact to an intervening signal routing layer disposed between the upper build-up layer and the first electrically conductive layer, the first via overlying the core via array, and
   a second electrically conductive via electrically connecting the intervening signal routing layer and the first electrically conductive layer, the second electrically conductive via not disposed over the core via array.

10. The substrate of claim 9, wherein the contact is VDDIO contact disposed in an interior portion of the substrate.

11. The substrate of claim 9, wherein the first electrically conductive layer is a VDDIO layer.

12. The substrate of claim 9, wherein the first via, intervening layer, and second via comprise a plurality of intervening layers and a plurality of electrically conductive vias electrically connecting the contact to the first electrically conductive layer.

13. A packaged integrated circuit including the substrate of claim 9.

14. A substrate, comprising:
   a non-electrically conductive core having a first side and an opposing second side,
   a VDDIO layer disposed on the first side of the core,
   a second electrically conductive layer disposed on the second side of the core,
   four build-up layers on each of the first side and the second side of the core,
   electrically conductive core vias extending from the first side of the core to the second side of the core, the core vias in an array centrally disposed in the substrate, wherein the core via array is too densely packed for the VDDIO layer to penetrate the core via array,
   an electrically conductive VDDIO contact formed on an upper-most of the build-up layers on the first side of the core, the VDDIO contact overlying the centrally disposed array of core vias,
   a first electrically conductive via electrically connecting the VDDIO contact to an intervening one of the build-up layers disposed between the upper-most build-up layer and the VDDIO layer, the first via overlying the core via array, where the intervening build-up layer is a signal routing layer, and
   a second electrically conductive via electrically connecting the intervening signal routing layer and the VDDIO layer, the second electrically conductive via not disposed over the core via array.

15. A packaged integrated circuit including the substrate of claim 14.

* * * * *